(12) United States Patent
Tanizawa et al.

(10) Patent No.: US 6,337,493 B1
(45) Date of Patent: Jan. 8, 2002

(54) NITRIDE SEMICONDUCTOR DEVICE (75) Inventors: Koji Tanizawa; Hiroki Narimatsu; Tomoaki Sakai; Tomotsugu Mitani, all of Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 09/553,062

(22) Filed: Apr. 20, 2000

(30) Foreign Application Priority Data

Apr. 21, 1999 (JP) ............................................ 11-113051

(51) Int. Cl.⁷ .............................................. H01L 27/15
(52) U.S. Cl. .............................. 257/79; 257/13; 257/21; 257/80; 257/83; 257/461; 257/918; 257/94; 257/96
(58) Field of Search ............................. 257/13, 21, 79, 257/80, 83, 461, 918, 94, 96; 372/43

(56) References Cited

U.S. PATENT DOCUMENTS

| | | | |
|---|---|---|---|
| 5,146,465 A | * 9/1992 | Khan et al. | 372/45 |
| 5,291,507 A | * 3/1994 | Haase et al. | 372/44 |
| 5,656,832 A | * 8/1997 | Ohba et al. | 257/190 |
| 5,777,350 A | * 7/1998 | Nakamura et al. | 257/96 |
| 5,834,331 A | * 11/1998 | Razeghi | 438/40 |
| 5,900,650 A | * 5/1999 | Nitta | 257/94 |
| 6,111,277 A | * 8/2000 | Ikeda | 257/99 |
| 6,118,801 A | * 9/2000 | Ishikawa et al. | 372/46 |
| 6,147,364 A | * 11/2000 | Itaya et al. | 257/76 |
| 6,153,894 A | * 11/2000 | Udagawa | 257/96 |
| 6,281,522 B1 | * 8/2001 | Ishibashi et al. | 257/77 |

FOREIGN PATENT DOCUMENTS

JP 08097471 * 4/1996

* cited by examiner

Primary Examiner—Eddie Lee
Assistant Examiner—Eugene Lee
(74) Attorney, Agent, or Firm—Volentine Francos, PLLC (57) ABSTRACT

A nitride semiconductor device comprising an n-type nitride semiconductor layer, an active layer having a quantum well structure including a well layer of a nitride semiconductor containing In, the p-type nitride semiconductor layer having a p-type contact layer, a p-type high concentration doped layer interposed between said active layer and said p-type contact layer and a p-type multi-film layer interposed between said active layer and said p-type high concentration doped layer.

18 Claims, 2 Drawing Sheets

NITRIDE SEMICONDUCTOR DEVICE

BACKGROUND OF THE INVENTION

1. Field of the Invention

The present invention relates to a nitride semiconductor (for example, $In_XAl_YGa_{1-X-Y}N$, $0 \leq X$, $0 \leq Y$, $X+Y \leq 1$) device for use in a light-emitting or light-receiving device such as a light-emitting diode (LED), a laser diode (LD), a solar cell, an optical sensor, or an electronic device such as a transistor or a power device.

2. Description of the Prior Art

Nitride semiconductors are put into practical use as a material for a highly bright blue LED or a purely green LED in various light sources such as a full-color LED display, a traffic signal lamp, or an image scanner light source. Basically, these LED devices have a structure in which a buffer layer made of GaN, an n-side contact layer made of Si-doped GaN, an active layer of a single quantum well (SQW) structure made of InGaN or a multi-quantum well (MQW) structure having InGaN, a p-side cladding layer made of Mg-doped AlGaN, and a p-side contact layer made of Mg-doped GaN are successively laminated on a sapphire substrate, and show extremely excellent characteristics, namely, 5 mW with an external quantum efficiency of 9.1% in the case of a blue LED having a light-emission wavelength of 450 nm at 20 mA, and 3 mW with an external quantum efficiency of 6.3% at 20 mA in the case of a green LED having a light-emission wavelength of 520 nm.

However, although the aforesaid LED devices disclosed by the applicant of the present invention have a high output to be fully applicable for practical use and are applied to various products such as a signal, a LED device capable of reducing the consumed power without decrease in the light-emission output is desired in accordance with the requirement of energy saving and others in recent years. In order to reduce the consumed power of the LED device, reduction in the forward bias voltage of the LED device may be considered.

For example, Japanese Laid-open Patent Publication No. 8-97471 discloses a light-emitting device in which a p-type contact layer has a two-layer structure including, from the electrode side, a first layer doped with Mg at $1 \times 10^{20}$ to $1 \times 10^{21}/cm^3$ and a second layer doped with Mg at a lower concentration than the first layer and within the range from $1 \times 10^{19}$ to $5 \times 10^{20}/cm^3$. However, since the value of Vf attained by the technique of the aforesaid publication is 4V, a further reduction is desired.

SUMMARY OF THE INVENTION

An object of the present invention is to provide a nitride semiconductor device capable of reducing the value of Vf.

Namely, the object of the present invention can be achieved by the following construction (1) to (9).

(1) A nitride semiconductor device comprising;
  a substrate,
  an n-type nitride semiconductor layer formed on the substrate,
  an active layer formed on the n-type nitride semiconductor layer and,
  a p-type nitride semiconductor layer formed on the active layer,
  wherein said active layer has a quantum well structure including a well layer made of a nitride semiconductor containing In and,
  said p-type nitride semiconductor layer has a p-type contact layer, a p-type high concentration doped layer interposed between said active layer and said p-type contact layer and a p-type multi-film layer interposed between said active layer and said p-type high concentration doped layer,
  said p-type multi-film layer formed by laminating alternately first nitride semiconductor layers containing Al and second nitride semiconductor layers having a different composition from said first nitride semiconductor layer, at least ones of said first nitride semiconductor layers and said second nitride semiconductor layers containing a p-type impurity,
  said p-type contact layer having a p-type impurity concentration higher than that of said p-type multi-film layer and lower than that of said p-type high concentration doped layer.

(2) A nitride semiconductor device as set forth in (1), characterized in that the nitride semiconductor device further comprises;
  a p-type low concentration doped layer interposed between said p-type multi-film layer and said p-type high concentration doped layer, said p-type low concentration doped layer having a p-type impurity concentration lower than that of said p-type multi-film layer.

(3) A nitride semiconductor device comprising;
  a substrate,
  an n-type nitride semiconductor layer formed on the substrate,
  an active layer formed on the n-type nitride semiconductor layer and,
  a p-type nitride semiconductor layer formed on the active layer,
  wherein said active layer has a quantum well structure including a well layer made of a nitride semiconductor containing In and,
  said p-type nitride semiconductor layer has a p-type contact layer, a p-type high concentration doped layer interposed between said active layer and said p-type contact layer and a p-type single film layer made of $Al_bGa_{1-b}N$ ($0 \leq b \leq 1$) containing a p-type impurity interposed between said active layer and said p-type high concentration doped layer,
  said p-type contact layer having a p-type impurity concentration higher than that of said p-type single film layer and lower than that of the said p-type high concentration doped layer.

(4) A nitride semiconductor device as set forth in (3), characterized in that the nitride semiconductor device further comprises;
  a p-type low concentration doped layer interposed between said p-type single film layer and said p-type high concentration doped layer, said p-type low concentration doped layer having a p-type impurity concentration lower than that of said p-type single film layer (5) A nitride semiconductor device as set forth in (1) or (2), characterized in that said p-type multi-film layer has a p-type impurity concentration in a range from $5 \times 10^{17}$ to $1 \times 10^{21}/cm^3$.

(6) A nitride semiconductor device as set forth in (3) or (4), characterized in that said p-type single film layer has a p-type impurity concentration in a range from $5 \times 10^{17}$ to $1 \times 10^{21}/cm^3$.

(7) A nitride semiconductor device as set forth in any one of (1) to (6), characterized in that said p-type high concentration doped layer has a p-type impurity concentration in the range from $5\times10^{18}$ to $1\times10^{22}$/cm$^3$.

(8) A nitride semiconductor device as set forth in any one of (1) to (7), characterized in that said p-type contact layer has a p-type impurity concentration in a range from $1\times10^{18}$ to $5\times10^{21}$/cm$^3$.

(9) A nitride semiconductor device as set forth in any one of (2) and (4) to (8), characterized in that said p-type low concentration doped layer has a p-type impurity concentration less than $1\times10^{19}$/cm$^3$.

Further, the present invention can make an improvement in the electrostatic breakdown voltage as well as reduction in Vf by the following construction (10) to (12), thereby advantageously increasing the reliability of the device.

(10) A nitride semiconductor device as set forth in any one of (1) to (9), characterized in that said n-type nitride semiconductor layer has an n-type first multi-film layer made by successive lamination of at least three layers including a lower layer made of an undoped nitride semiconductor, a middle layer made of a nitride semiconductor doped with an n-type impurity, and an upper layer made of an undoped nitride semiconductor.

(11) A nitride semiconductor device as set forth in any one of (1) to (10), characterized by having an undoped GaN layer and an n-type contact layer containing an n-type impurity that are successively formed on said substrate.

(12) A nitride semiconductor device as set forth in (11), characterized in that said n-type first multi-film layer is formed on said n-type contact layer, and further the combined thickness of said undoped GaN layer, said n-type contact layer, and said n-type first multi-film layer is 2 to 20 μm.

In other words, according to the present invention, at least three p-type impurity containing layers having different p-type impurity concentrations, i.e. a p-type multi-film layer doped at a low concentration or a p-type single film layer doped at a low concentration, a p-type high concentration doped layer doped at a high concentration, and a p-type contact layer doped at a middle concentration, are successively formed as p-type nitride semiconductor layers formed on an active layer. By using these three layers having different concentrations in combination while adjusting the p-type impurity concentrations to be a low concentration, a high concentration, and a middle concentration, it is possible to provide a nitride semiconductor device capable of reducing the value of Vf.

In the aforesaid Japanese Laid-Open Patent Publication No. 8-97471, the p-type impurity concentrations of a plurality of nitride semiconductor layers formed on an active layer are made to become gradually higher in the direction towards an electrode.

In contrast, the present invention can produce a conspicuous effect by successively forming a p-type cladding layer doped at a low concentration, a p-type high concentration doped layer doped at a high concentration, and a p-type contact layer doped at a middle concentration, as described above.

In the present invention, the aforementioned terms "low concentration", "middle concentration", and "high concentration" refer to a relative relationship of the p-type impurity concentrations among the aforesaid three layers formed on the active layer.

Further, in the present invention, the p-type multi-film layer doped at a low concentration and the p-type single film layer doped at a low concentration are formed on an upper layer of the active layer and usually function as cladding layers, so that these layers will be hereafter described by assuming them to be p-type cladding layers. However, the p-type multi-film layer doped at a low concentration and the p-type single film layer doped at a low concentration recited in the claims are not limited to cladding layers alone.

Further, in the present invention, the p-type impurity concentration of the p-type multi-film layer made of a multi-layered film refers to an average concentration of the layers constituting the multi-layered film.

Furthermore, in the present invention, if a p-type low concentration doped layer containing a p-type impurity at a lower concentration than the p-type multi-film layer and the p-type single film layer is disposed between the p-type multi-film layer or single film layer (p-type cladding layer) and the p-type high concentration doped layer, it is preferable in view of reduction in Vf and improvement in the electrostatic breakdown voltage. An device made of a nitride semiconductor has, due to its structure, a possibility of being deteriorated even by a voltage of 100V which is far weaker than a static electricity generated in a human being. For example, there is a possibility of being deteriorated when the device is taken out from an antistatically treated bag or the like, or when it is incorporated in a product. By forming the p-type low concentration doped layer as described above, an device having a high electrostatic breakdown voltage with low Vf can be obtained, thereby increasing the reliability of the nitride semiconductor device.

Further, in the present invention, the concentration of the p-type impurity in the p-type multi-film layer is preferably $5\times10^{17}$ to $1\times10^{21}$/cm$^3$ in view of improvement in light-emission output and reduction in Vf.

Further, in the present invention, the concentration of the p-type impurity in the p-type single film layer is preferably $5\times10^{17}$ to $1\times10^{21}$/cm$^3$ in view of improvement in light-emission output and reduction in Vf.

Further in the present invention, the concentration of the p-type impurity in the p-type high concentration doped layer is $5\times10^{18}$ to $1\times10^{22}$/cm$^3$ in view of reduction in Vf.

Further, in the present invention, the concentration of the p-type impurity in the p-type contact layer is preferably $1\times10^{18}$ to $5\times10^{21}$/cm$^3$ in view of reduction in Vf.

Further, in the present invention, the concentration of the p-type impurity in the p-type low concentration doped layer is preferably less than $1\times10^{19}$/cm$^{31}$, in view of improvement in electrostatic breakdown voltage and improvement in light-emission output.

The p-type impurity concentrations of the p-type cladding layer, the p-type high concentration doped layer, and the p-type contact layer described above are suitably selected and adjusted within the above-described ranges so that they may have a low concentration, a high concentration, and a middle concentration, respectively in their relation ship. Further, the p-type impurity concentration of the aforesaid p-type low concentration doped layer is adjusted to be contained within the above-described range so that the concentration may be further lower than the concentration of the p-type cladding layer doped at a low concentration.

Here, in the present invention, the terms "low concentration", "high concentration", and "middle concentration" refer to a relative relationship of the p-type impurity concentrations among the three layers including the p-type cladding layer, the p-type high concentration doped layer, and the p-type contact layer. Further, if the p-type low concentration doped layer is formed, the p-type low concentration doped layer has a concentration lower than the p-type cladding layer.

Still further, in the present invention, the n-type nitride semiconductor layer preferably has an n-type first multi-film layer made by successive lamination of at least three layers- including a lower layer made of an undoped nitride semiconductor, a middle layer made of a nitride semiconductor doped with an n-type impurity, and an upper layer made of an undoped nitride semiconductor, in view of improvement in electrostatic breakdown voltage as well as reduction in Vf by combination with the aforesaid layers on the p-side.

Still further, in the present invention, the nitride semiconductor device preferably has an n-type contact layer containing an n-type impurity and an undoped GaN layer that are formed on the substrate side of the n-type first multi-film layer successively towards the substrate, in view of further improvement in electrostatic breakdown voltage.

Still further, in the present invention, the combined thickness of the undoped GaN layer, the n-type contact layer, and the n-type first multi-film layer is preferably 2 to 20 $\mu$m, more preferably 3 to 10 $\mu$m, still more preferably 4 to 9 $\mu$m, in view of further improvement in electrostatic breakdown voltage. Also, the thickness within the above-described range gives good device characteristics other than the electrostatic breakdown voltage. Further, the combined thickness of the aforesaid three layers are suitably adjusted within the preferable range of the thickness of each layer so that the combined thickness of the three layers may be within the above-described range.

As described above, the present invention can make further improvements in light-emission output and electrostatic breakdown voltage as well as good reduction in Vf, by combining the above-described specific three kinds of p-type layers further with the specific n-type layers, thereby increasing the reliability of the nitride semiconductor device and making it possible to widen the range of application to various products to which the nitride semiconductor device is applied.

Further, the term "undoped" recited in the explanation of a later-mentioned device structure refers to a layer formed without intentional doping with a impurity. Therefore, an "undoped" layer may refer to a layer having a impurity mixed therewith by diffusion of the impurity from an adjacent layer or by contamination from a source material or an apparatus, provided that the layer is not intentionally doped with the impurity. Here, in some cases, the impurity mixed by diffusion may have a gradient impurity concentration within the layer.

Further, in the present invention, difference in the composition refers to difference, for example, in the devices constituting the nitride semiconductor (for example, the kinds of devices in a two-device mixed crystal or a ternary compound crystal), a ratio of the elements, or a band gap energy. Further, if a specific layer is constructed with a multi-layered film, these values may refer to an average value of the whole layer.

A concrete example in which the aforesaid first nitride semiconductor layer and the aforesaid second nitride semiconductor layer have different compositions according to the present invention may be one in which the ratio of elements, the band gap energy, or the like is different as described above.

Further, in the present invention, the impurity concentration may be measured by various measuring methods, for example, by secondary ion mass spectrometry (SIMS).

DETAILED DESCRIPTION OF THE PREFERRED EMBODIMENTS

Figure 1:
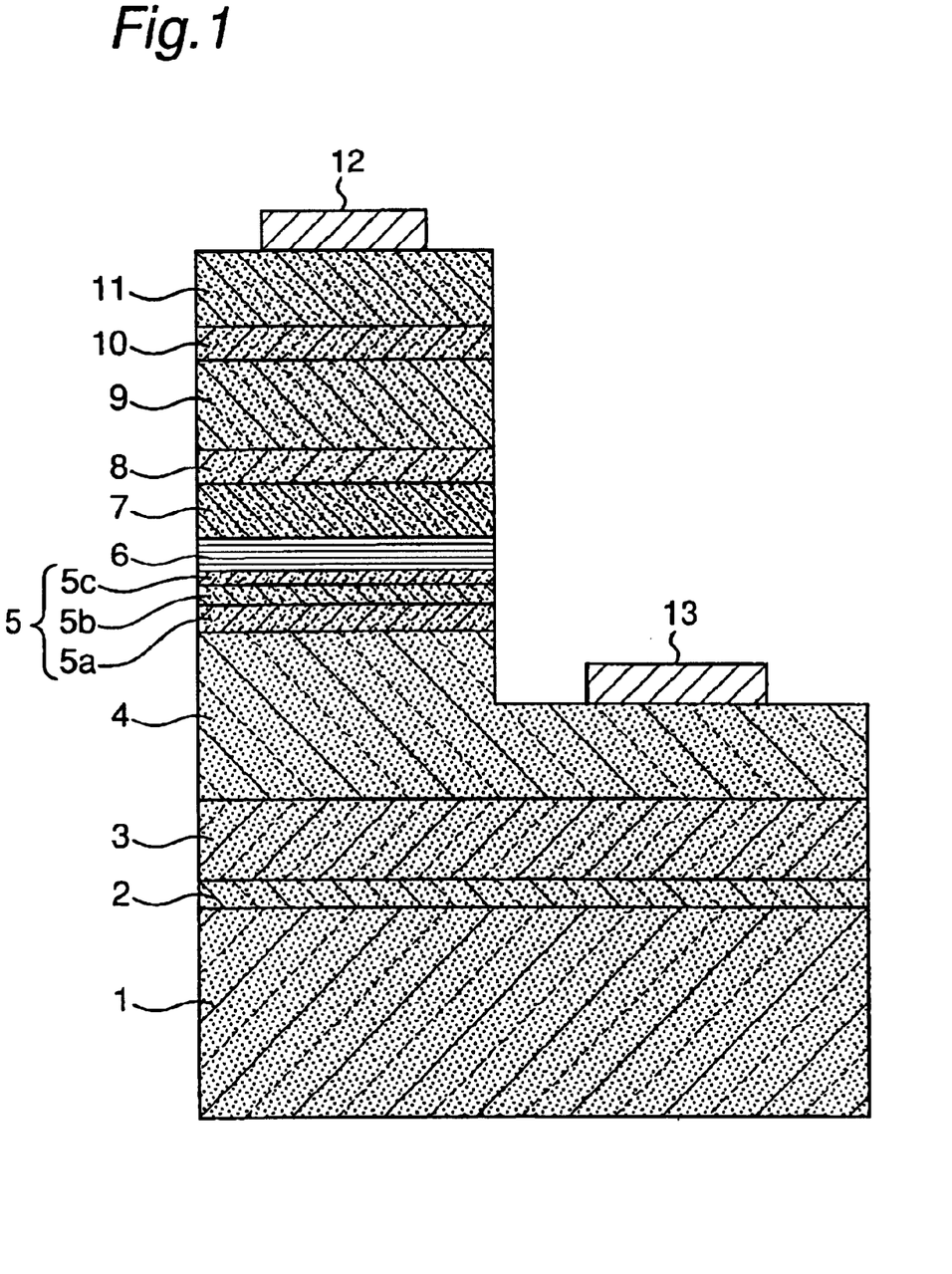
FIG. 1 is a cross-sectional model view showing a structure of a LED device according to one embodiment of the present invention.

The nitride semiconductor device according to the present invention is not particularly limited as long as it is an device having an device structure including at least the aforesaid p-type cladding layer (p-type multi-film layer or a p-type single film layer) doped with a p-type impurity at a low concentration, the aforesaid p-type high concentration doped layer doped with a p-type impurity at a high concentration, and the aforesaid p-type contact layer doped with a p-type impurity at a middle concentration on the active layer. A nitride semiconductor device according to a preferable embodiment of the present invention is a nitride semiconductor device having an device structure shown in FIG. 1. However, the present invention is not limited to FIG. 1 alone. FIG. 1 is a cross-sectional model view illustrating an device structure of a nitride semiconductor device. The present invention will be described in detail with reference to FIG. 1.

FIG. 1 shows a structure in which a buffer layer 2, an undoped GaN layer 3, an n-type contact layer 4 containing an n-type impurity, an n-side first multi-film layer 5 made of three layers including an undoped lower layer 5a, a middle layer 5b doped with an n-type impurity, and an undoped upper layer 5c, an n-side second multi-film layer 6 made of third and fourth nitride semiconductor layers, an active layer 7 having a multi-quantum well structure, a p-type cladding layer 8 made of a multi-layered film or a single film doped with a p-type impurity at a low concentration (p-type multi-film layer or a p-type single film layer), a p-type low concentration doped layer 9 doped with a p-type impurity at a concentration lower than the p-type cladding layer 8, a p-type high concentration doped layer 10 doped with a p-type impurity at a high concentration, and a p-type contact layer 11 doped with a p-type impurity at a middle concentration, are successively laminated on a substrate 1.

Further, an n-electrode 13 is formed on the n-type contact layer 4, and a p-electrode 12 is formed on the p-type contact layer 11.

In FIG. 1, the substrate 1 can be an insulating substrate such as sapphire having a sapphire C surface, R surface, or A surface as a principal surface, or spinel ($MgAl_2O_4$), or a semiconductor substrate such as SiC (including 6H, 4H, and 3C), Si, ZnO, GaAs, or GaN.

In FIG. 1, the buffer layer 2 is a nitride semiconductor made of $Ga_dAl_{1-d}N$ (d is within the range of $0<d\leq1$). The smaller the ratio of Al is, the more preferable it is, because an improvement in crystallinity can be made. More preferably, the buffer layer 2 is made of GaN.

The thickness of the buffer layer 2 is adjusted to be within the range from 0.002 to 0.5 $\mu$m, preferably 0.005 to 0.2 $\mu$m, more preferably 0.01 to 0.02 $\mu$m. If the buffer layer 2 has a thickness within the above-mentioned range, the crystal morphology of the nitride semiconductor will be good, thereby making it possible to provide a good crystallinity of a nitride semiconductor to be grown on the buffer layer 2.

The growth temperature of the buffer layer 2 is adjusted to be within the range from 200 to 900° C., preferably 400 to 800° C. A growth temperature within the above-mentioned range is preferable because a good polycrystal can be obtained and, with this polycrystal serving as a seed crystal, the nitride semiconductor grown on the buffer layer 2 can have a good crystallinity.

Further, the buffer layer 2 grown at such a low temperature can be omitted depending on the type of the substrate, the growth method, and others.

Next, in FIG. 1, the undoped GaN layer 3 is a GaN layer grown without addition of an n-type impurity during the growth. If the undoped GaN layer 3 is grown on the buffer layer 2, the undoped GaN layer 3 will have a good crystallinity, and the n-side contact layer 4 and others grown on the undoped GaN layer 3 will also have a good crystallinity. The thickness of the undoped GaN layer 3 is not smaller than 0.01 $\mu$m, preferably not smaller than 0.5 $\mu$m, more preferably not smaller than 1 $\mu$m. The thickness is preferably within this range, because then the n-side contact layer 4 and subsequent layers can be grown with good crystallinity. Further, the upper limit of the thickness of the undoped GaN layer 3 is not particularly limited; however, it is suitably adjusted by taking the production efficiency and others in consideration. Further, it is preferable if the thickness of the undoped GaN layer 3 is within the above-mentioned range, and the combined thickness of the undoped GaN layer 3, the n-type contact layer 4, and the n-side first multi-film layer 5 is adjusted to be 2 to 20 $\mu$m, because then the electrostatic breakdown voltage can be improved.

Next, in FIG. 1, the n-type contact layer containing an n-type impurity contains the n-type impurity at a concentration of not lower than $3 \times 10^{18}/cm^3$, preferably $5 \times 10^{18}/cm^3$. If a layer is doped with an n-type impurity and the layer is made into an n-type contact layer, the value of Vf and the threshold voltage can be reduced. If the impurity concentration falls out of the above-mentioned range, the value of vf is unlikely to decrease. If the n-type contact layer 4 is formed on the undoped GaN layer 3 having a low n-type impurity concentration and having a good crystallinity, it can be grown to have a good crystallinity though it contains an n-type impurity at a high concentration. The upper limit of the n-type impurity concentration in the n-type contact layer 4 is not particularly limited; however, it is preferably not higher than $5 \times 10^{21}/cm^3$ so that it can maintain a function as a contact layer.

The composition of the n-type contact layer 4 can be constructed with $In_eAl_fGa_{1-e-f}N$ ($0 \leq e$, $0 \leq f$, $e+f \leq 1$), and the composition is not specifically questioned. However, it is preferably GaN or $Al_fGa_{1-f}N$ having a value f of not greater than 0.2, because then a nitride semiconductor layer having fewer crystal defects is likely to be obtained. The thickness of the n-type contact layer 4 is not specifically questioned. However, since it is a layer on which the n-electrode is formed, it is preferably 0.1 to 20 $\mu$m, more preferably 1 to 10 $\mu$m. A thickness within the above-mentioned range is preferable because then the resistance value can be reduced, and Vf of the light-emitting device can be reduced. Further, if the thickness of the n-type contact layer 4 is within the above-mentioned range, it is preferable in view of improving the electrostatic breakdown voltage by adjusting the thickness with the undoped GaN layer 3 and the n-type first multi-film layer 5.

Further, the n-type contact layer 4 can be omitted by forming the later-mentioned n-type first multi-film layer 5 to have a large thickness.

Next, in FIG. 1, the n-type first multi-film layer 5 is constructed with at least three layers including an undoped lower layer 5a, a middle layer 5b doped with an n-type impurity, and an undoped upper layer 5c from the substrate side. Further, the n-type first multi-film layer may include other layers besides the aforesaid lower layer 5a to upper layer 5c. Further, the n-type first multi-film layer 5 may be in contact with the active layer or may have another layer disposed between the n-type first multi-film layer 5 and the active layer.

Here, it is preferable to have this n-type first multi-film layer 5, in view of improvement in light-emission output and improvement in electrostatic breakdown voltage. The n-side first multi-film layer 5 seems to be comparatively involved in the improvement of electrostatic breakdown voltage. Further, in the nitride semiconductor device of the present invention, the n-type first multi-film layer 5 is preferably combined with the three kinds of layers having different p-type impurity concentrations of the present invention, in view of improvement in electrostatic breakdown voltage and improvement in the light-emission output as well as reduction in Vf.

The nitride semiconductors constituting the aforesaid lower layer 5a to upper layer 5c may be nitride semiconductors having various compositions and represented by $In_gAl_hGa_{1-g-h}N$ ($0 \leq g < 1$, $0 \leq h < 1$), preferably a nitride semiconductor having a composition made of GaN. Further, the layers in the first multi-film layer 5 may have either the same composition or different compositions.

The thickness of the n-type first multi-film layer 5 is not particularly limited; however, it is 175 to 12000 angstrom, preferably 1000 to 10000 angstrom, more preferably 2000 to 6000 angstrom. If the thickness of the first multi-film layer 5 is within the above-mentioned range, it is preferable in view of optimization of Vf and improvement in electrostatic breakdown voltage. Further, if the thickness of the n-type first multi-film layer 5 is within the above-mentioned range, it is preferable in view of improving the electrostatic breakdown voltage by adjusting the thickness with the undoped GaN layer 3 and the n-type contact layer 4.

Regarding the adjustment of the thickness of the first multi-film layer 5 having a thickness within the above-mentioned range, the combined thickness of the first multi-film layer 5 is preferably set to be within the above-mentioned range by suitably adjusting each thickness of the lower layer 5a, the middle layer 5b, and the upper layer 5c.

The thickness of each of the lower layer 5a, the middle layer 5b, and the upper layer 5c constituting the n-type first multi-film layer 5 is not particularly limited. However, since the influence given on the various characteristics of the device performance varies a little depending on the position of lamination in the n-type first multi-film layer 5, an attention is paid particularly to the property of each layer largely involved in the device performance, and a thickness range giving good characteristics is measured by fixing the thickness of any two layers and varying the thickness of the remaining one layer step by step. Further, the thickness range is specified by adjustment with each layer in the n-type first multi-film layer 5.

Regarding the layers in the n-type first multi-film layer 5, the various device characteristics as a whole will be good and also the light-emission output and the electrostatic breakdown voltage will be considerably good by combining the layers into the n-type first multi-film layer 5. It can be said that such functions and effects are obtained for the first time by actually producing an device made of lamination of the layers in the n-type multi-film layer 5. The film thickness of each layer will be hereafter specifically described, and the tendency of change in the device characteristics caused by change in the film thickness will be schematically described.

The thickness of the undoped lower layer 5a is 100 to 10000 angstrom, preferably 500 to 8000 angstrom, more preferably 1000 to 5000 angstrom. Regarding the undoped lower layer 5a, the electrostatic breakdown voltage rises according as the film thickness gradually increases, but Vf sharply rises near 10000 angstrom. On the other hand, as the film thickness becomes smaller, Vf decreases, but the decrease in electrostatic breakdown voltage becomes larger. At less than 100 angstrom, a tendency is found such that the decrease in the yield becomes large in accordance with the decrease in electrostatic breakdown voltage. Further, since the lower layer 5a seems to make an improvement in reduction of the influence of the decrease in crystallinity of the n-type contact layer 4 containing an n-type impurity, it is preferably grown to have a thickness of such a degree as to make a good improvement in crystallinity.

The thickness of the middle layer 5b doped with an n-type impurity is 50 to 1000 angstrom, preferably 100 to 500 angstrom, more preferably 150 to 400 angstrom. This middle layer 5b doped with a impurity is a layer that acts comparatively largely on the light-emission output by making the carrier concentration sufficient. If this layer is not formed, there is a tendency that the light-emission output decreases as compared with the case in which it is formed. Further, if the film thickness exceeds 1000 angstrom, there is a tendency that the light-emission output decreases. On the other hand, if only the electrostatic breakdown voltage is taken into consideration, the electrostatic breakdown voltage is good if the film thickness of the middle layer 5b is large. However, if the film thickness is less than 50 angstrom, there is a tendency that the decrease in electrostatic breakdown voltage is large as compared with the case in which the film thickness is not smaller than 50 angstrom.

The film thickness of the undoped upper layer 5c is 25 to 1000 angstrom, preferably 25 to 500 angstrom, more preferably 25 to 150 angstrom. This undoped upper layer 5c is formed in contact with the active layer or nearest to the active layer in the first multi-layered film, and is largely involved in prevention of leakage currents. If the upper layer 5c has a thickness smaller than 25 angstrom, there is tendency that leakage currents increase. On the other hand, if the film thickness of the upper layer 5c exceeds 1000 angstrom, the value of Vf rises and there is a tendency that the electrostatic breakdown voltage decreases.

Thus, by paying attention to the device characteristics that are liable to be influenced by the variation in the thickness of each layer, the film thicknesses of the lower layer 5a to the upper layer 5c are set so that all of the various device characteristics may satisfy the requirements and be good when the lower layer 5a, the middle layer 5b, and the upper layer 5c are combined. Particularly, by making various studies in order to provide good light-emission output and good electrostatic breakdown voltage, setting the film thicknesses of the lower layer 5a to the upper layer 5c to be within the above-mentioned ranges, and combining them with the aforesaid three kinds of layers of the present invention formed on the p-side and having different p-type impurity concentrations, improvements in the light-emission output and in the reliability of products can be achieved, and also a better electrostatic breakdown voltage can be provided.

It is sufficient if the composition of each layer constituting the aforesaid first multi-film layer 5 is a composition represented by $In_gAl_hGa_{1-g-h}N$ ($0 \leq g < 1$, $0 \leq h < 1$), and the compositions of the layers may be the same or different. It is preferably a composition having a small ratios of In and Al, more preferably $Al_hGa_{1-h}N$ in view of crystallinity and reduction in Vf, still more preferably a layer made of GaN. If the n-type first multi-film layer 5 is $Al_hGa_{1-h}N$, the Al composition ratio is suitably adjusted within the range of $0 \leq h < 1$. However, a smaller Al composition ratio is preferable in view of crystallinity and reduction in Vt.

The doping amount of the n-type impurity in the middle layer 5b doped with the n-type impurity in the aforesaid first multi-film layer 5 is not particularly limited, but it is contained at a concentration of not lower than $3 \times 10^{18}/cm^3$, preferably not lower than $5 \times 10^{18}/cm^3$. The upper limit of the n-type impurity concentration is not particularly limited, but it is preferably not higher than $5 \times 10^{21}/cm^3$ so as not to deteriorate the crystallinity. If the impurity concentration in the middle layer of the first multi-film layer is within the aforesaid range, it is preferable in view of improvement in light-emission output and reduction in Vf.

As the n-type impurity, a Group IVB or Group VIB element in the periodic table, such as Si, Ge, Se, S, or O is selected, and preferably Si, Ge, or S is selected as the n-type impurity.

Also, at an interface of the aforesaid first multi-film layer 5, it serves as both of two layers within the range that does not deteriorate the functions of each layer and the device.

Also, in lieu of the aforesaid n-side first multi-film layer 5, it is possible to form a single undoped layer made of $In_gAl_hGa_{1-g-h}N$ ($0 \leq g < 1$, $0 \leq h < 1$) preferably a composition with small ratios of In and Al, more preferably GaN or $Al_hGa_{1-h}N$ in view of crystallinity and reduction in Vf, still more preferably GaN. If the single undoped layer is $Al_hGa_{1-h}N$, the Al composition ratio is preferably smaller in view of crystallinity and reduction in Vf, and is suitably adjusted within the range of $0 \leq h < 1$. If the single undoped layer is thus formed, almost similar device characteristics can be obtained although there is a tendency that the electrostatic breakdown voltage decreases a little as compared with the case in which the n-side first multi-film layer 5 is formed.

The film thickness of the single undoped layer is not particularly limited, but it is preferably 1000 to 3000 angstrom so as to provide good device characteristics.

Next, in FIG. 1, the n-type second multi-film layer 6 is made of an n-side multi-film layer obtained by lamination of a third nitride semiconductor layer containing In and a fourth nitride semiconductor layer having a different composition from the third nitride semiconductor layer. Combination of this n-type second multi-film layer 6 with the aforesaid three layers having different p-type impurity concentrations is preferable because an improvement in light-emission output can be made as well as reduction in Vf.

In the n-type second multi-film layer, the thicknesses of at least one of the third nitride semiconductor layer and the fourth nitride semiconductor layer mentioned above, preferably the thicknesses of both, are set to be not larger than 100 angstrom, more preferably not larger than 70 angstrom, still more preferably not larger than 50 angstrom. By thus reducing the film thickness, the multi-film layer will have a super lattice structure to provide good crystallinity of the multi-film layer, so that there is a tendency that the output is improved.

Even if the thicknesses of at least one of the third and the fourth nitride semiconductors is smaller than or equal to 100 angstrom, the thinner layer will have a thickness below an elastic critical thickness, whereby the crystals will be good, the crystallinity of the third nitride semiconductor layer or the fourth nitride semiconductor layer laminated thereon will be good, and the crystallinity of the whole multi-film layer will be good to improve the output of the device.

Further, if the thicknesses of both of the third and fourth nitride semiconductors are smaller than or equal to 100 angstrom, the thicknesses will be below the elastic critical thickness of a nitride semiconductor single layer, so that a nitride semiconductor having a good crystallinity can be grown as compared with the case in which they are grown to be thick or the case in which one of the third and fourth nitride semiconductors has a thickness small than or equal to 100 angstrom. Further, if both are smaller than or equal to 70 angstrom, the n-type second multi-film layer 6 will have a super lattice structure and, if the active layer is grown on this multi-layered film structure having a good crystallinity, the n-type second multi-film layer 6 serves like a buffer layer, so that the active layer can be grown with better crystallinity.

In the present invention, if the aforesaid n-type first multi-film layer and the above-described n-type second multi-film layer are used as the n-type nitride semiconductor layer, and the three kinds of layers having different p-type impurity concentrations are used as the p-type nitride semiconductor layer, it is preferable because improvement in the light-emission output and improvement in the electrostatic breakdown voltage can be made. The cause of this is not clear, but it seems to be because the distribution of electric current density in an epi-film is improved to make a uniform flow of the electric current in the light-emission surface. Further, although this is not clear as the cause, it seems to be because the crystallinity of the active layer to be grown on the n-type second multi-film layer will be good.

Further, the thicknesses of the aforesaid third nitride semiconductor layers or the aforesaid fourth nitride semiconductor layers in the n-type second multi-film layer 6 may be different from each other or the same with each other among the third nitride semiconductor layers or among the fourth nitride semiconductor layers. For example, in the case where the third nitride semiconductor layer is InGaN and the fourth nitride semiconductor layer is GaN, the thickness of the InGaN layer may be gradually increased or decreased according as it approaches the active layer, whereby a layer with gradually changing refractive index can be formed because the refractive index changes within the multi-film layer. In other words, it provides substantially the same effect as in the case of forming a nitride semiconductor layer having a gradient composition. Thus, for example, in an device such as a laser device that requires an optical waveguide path, the waveguide path can be formed with this multi-film layer to adjust the mode of laser light.

Further, the compositions of Group III elements in the third nitride semiconductor layers or the fourth nitride semiconductor layers may be different from each other or the same with each other among the third nitride semiconductor layers or among the fourth nitride semiconductor layers.

For example, if the compositions of the same Group III element are made different from each other, in the case where the third nitride semiconductor layers are InGaN and the fourth nitride semiconductor layers are GaN, the refractive index can be changed within the multi-film layer by gradually increasing or decreasing the In composition in the InGaN layers according as they approach the active layer, whereby a nitride semiconductor layer having a gradient composition can be formed. Here, the refractive index tends to become smaller according as the In composition decreases.

Regarding the third nitride semiconductor layer and the fourth nitride semiconductor layer in the n-type second multi-film layer 6, at least one layer or more are formed for each, and two or more layers in total, preferably three or more layers, still more preferably at least two or more layers for each are laminated to form a laminate of four or more layers in total.

The n-type second multi-film layer 6 may be formed to be spaced apart from the active layer; however, it is most preferably formed to be in contact with the active layer. If it is formed to be in contact with the active layer, the output tends to be more improved.

If the n-type second multi-film layer 6 is formed to be in contact with the active layer, the multi-film layer which is in contact with the first layer (well layer or barrier layer) of the active layer may be either the third nitride semiconductor layer or the fourth semiconductor layer, and the order of lamination in the n-type second multi-film layer 6 is not specifically questioned. Here, in FIG. 1, the n-type second multi-film layer 6 is formed to be in contact with the active layer 7. However, a layer made of another n-type semiconductor may be disposed between the n-type second multi-film layer 6 and the active layer.

The third nitride semiconductor layer is made of a nitride semiconductor containing In, preferably ternary compound crystal $In_kGa_{1-k}N$ (0<k<1), more preferably $In_kGa_{1-k}N$ with a value k of 0.5 or less, most preferably $In_kGa_{1-k}N$ with a value k of 0.2 or less. On the other hand, the fourth nitride semiconductor layer is not particularly limited as long as it is made of a nitride semiconductor having a different composition from the third nitride semiconductor layer. However, in order to grow the fourth nitride semiconductor with good crystallinity, binary compound crystal or ternary compound crystal $In_mGa_{1-m}N$ (0≦m<1, m<k) having a larger band gap energy than the third nitride semiconductor layer is grown, and preferably it is GaN. If the fourth nitride semiconductor is GaN, a multi-film layer having a good crystallinity as a whole can be grown. As a preferable combination, the third nitride semiconductor is $In_kGa_{1-k}N$ (0<k<1) and the fourth nitride semiconductor is $In_mGa_{1-m}N$ (0≦m<1, m<k), preferably GaN. As a still more preferable combination, the third nitride semiconductor layer is made of $In_kGa_{1-k}N$ with a value k of 0.5 or less, and the fourth nitride semiconductor layer is made of GaN.

The third and fourth nitride semiconductor layers may be both undoped, or both doped with n-type impurity, or either one may be doped with a impurity (modulation doping). In order to provide good crystallinity, both are most preferably undoped, less preferably modulation-doped, and least preferably both are doped. Here, if both are doped with n-type impurity, the n-type impurity concentration in the third nitride semiconductor layer and the n-type impurity concentration in the fourth nitride semiconductor layer may be different.

The term "modulation doping" refers to the state in which either one of the third nitride semiconductor layer and the fourth nitride semiconductor layer is doped with an n-type impurity. By performing such a modulation doping, there is a tendency that the output is likely to be improved.

Here, as the n-type impurity, a Group IV or Group VI element such as Si, Ge, Sn, or S is preferably selected, and more preferably Si or Sn is used.

In the case of doping with an n-type impurity, the impurity concentration is adjusted to be not higher than $5\times10^{21}/cm^3$, preferably not higher than $1\times10^{20}/cm^3$. If the impurity concentration is higher than $5\times10^{21}/cm^3$, the crystallinity of the nitride semiconductor layer will be poor, whereby conversely the output tends to decrease. This applies to the case of modulation doping as well.

Next, in the present invention, the active layer 7 has a quantum well structure including a well layer made of a nitride semiconductor containing In, and may have either a single quantum well structure or a multi-quantum well structure. If the active layer has a single quantum well structure, it is preferable in view of the fact that the structure can be simplified. If the active layer has a multi-quantum well structure, it is preferable in view of making an improvement in the light-emission output.

In the present invention, the active layer 7 having a quantum well structure is made of a nitride semiconductor containing In and Ga, preferably $In_aGa_{1-a}N$ ($0 \leq a < 1$), and may be either n-type or p-type. However, the active layer 7 is preferably undoped (with no impurity added), because then an intense interband light-emission is obtained to narrow the half value width of the light-emission wavelength. The active layer 7 may be doped with an n-type impurity and/or a n-type impurity. If the active layer 7 is doped with an n-type impurity, the interband light-emission intensity can be increased as compared with the undoped one. If the active layer 7 is doped with a p-type impurity the peak wavelength can be shifted to an energy side which is lower by about 0.5 eV than the peak wavelength of the interband light-emission, but the half value width will be widened. If the active layer is doped with both a p-type impurity and an n-type impurity, the light-emission intensity of the aforesaid active layer doped with the p-type impurity can be further increased. Particularly, in the case or forming an active layer doped with a p-type impurity, the total conductivity type of the active layer is preferably made n-type by doping it with an n-type impurityuch as Si as well. In order to grow the active layer with good crystallinity, the active layer is most preferably non-doped.

If the active layer 7 has a multi-quantum well structure, the order of lamination of the barrier layer and the well layer in the active layer 7 is not specifically questioned. The active layer 7 may start lamination with the well layer and end with the well layer; it may start lamination with the well layer and end with the barrier layer; it may start lamination with the barrier layer and end with the barrier layer; and it may start lamination with the barrier layer and end with the well layer. The thickness of the well layer is adjusted to be not larger than 100 angstrom, preferably not larger than 70 angstrom, more preferably not larger than 50 angstrom. The upper limit of the thickness of the well layer is not particularly limited, but it is not smaller than one-atom layer, preferably not smaller than 10 angstrom. If the well layer has a thickness larger than 100 angstrom, there is a tendency that the output is unlikely to be improved.

On the other hand, the thickness of the barrier layer is adjusted to be not larger than 2000 angstrom, preferably not larger than 500 angstrom, more preferably not larger than 300 angstrom. The upper limit of the thickness of the barrier layer is not particularly limited, but it is not smaller than one-atom layer, preferably not smaller than 10 angstrom. If the barrier layer has a thickness within the above-mentioned range, it is preferable because then the output is likely to be improved. Further, the total thickness of the active layer 7 is not particularly limited. However, the total thickness of the active layer 7 is adjusted by adjusting the number of laminated barrier layers, the number of laminated well layers, and the order of lamination in consideration of a desired wavelength and the like of a LED device or the like.

The thickness of the active layer 7 having a single quantum well structure is suitably adjusted within a thickness range similar to the aforesaid thickness range of the well layer of the active layer having a multi-quantum well structure.

In the present invention, the p-type cladding layer 8 is formed of a multi-layered film or a single layer film containing a p-type impurity as to have a lower concentration than the p-type high concentration doped layer 10 and the p-type contact layer 11 as described before.

First, an explanation will be hereafter given on a case (p-type multi-film layer) in which the p-type cladding layer 8 has a multi-layered film structure (super lattice structure). Hereafter, the p-type cladding layer made of a multi-layered film will be referred to as a multi-layered film p-type cladding layer.

The multi-layered film constituting the multi-layered film p-type cladding layer is made by lamination of a first nitride semiconductor layer containing Al and a second nitride semiconductor layer having a different composition from the first nitride semiconductor layer, wherein at least one of the first nitride semiconductor layer and the second nitride semiconductor layer contains a p-type impurity. Hereafter, the explanation will be given by assuming that the difference of composition between the first nitride semiconductor layer and the second nitride semiconductor layer means difference of band gap energy.

In the present invention, the multi-layered film p-type cladding layer 8 may be made by lamination of a first nitride semiconductor layer having a large band gap energy and a second nitride semiconductor layer having a smaller band gap energy than the first nitride semiconductor layer. At least one of the first nitride semiconductor layer and the second nitride semiconductor layer contains a p-type impurity, and the p-type impurity concentrations in the first nitride semiconductor layer and the second nitride semiconductor layer may be the same or different.

The thicknesses of the first and second nitride semiconductor layers constituting the multi-layered film of the multi-layered film p-type cladding layer 8 are adjusted to be not larger than 100 angstrom, more preferably not larger than 70 angstrom, most preferably 10 to 40 angstrom, and the thicknesses of the first nitride semiconductor layer and the second nitride semiconductor layer may be the same or different. If the thickness of each film in the multi-layered film structure is within the above-mentioned range, it will be less than an elastic critical film thickness of nitride semiconductor, so that a nitride semiconductor having a good crystallinity can be grown as compared with the case of growing it to be thick, and also the crystallinity of the nitride semiconductor layer will be good. This makes it possible to obtain a p-layer having a large carrier concentration and a low resistivity when a p-type impurity is added, and there is a tendency that Vf and the threshold value of the device are likely to decrease. The multi-film layer is formed by laminating a pair of the two kinds of layers having such thicknesses, for a plurality of times. Further, one of the two kinds of layers may be laminated for one more in number than the other of the two kinds of layers. For example, the lamination may start with the first nitride semiconductor layer and end with the first nitride semiconductor layer.

The adjustment of the total thickness of the multi-layered film p-type cladding layer 8 is made by adjusting the thickness of each of the first and second nitride semiconductor layers and adjusting the number of lamination times. The total thickness of the multi-layered film p-type cladding layer 8 is not particularly limited, but it is not larger than 2000 angstrom, preferably not larger than 1000 angstrom, more preferably not larger than 500 angstrom. If the total thickness is within this range, it is preferable because the light-emission output is high and Vf decreases.

The first nitride semiconductor layer is preferably made by growing a nitride semiconductor containing at least Al, more preferably $Al_nGa_{1-n}N$ ($0<n\leq 1$); and the second nitride semiconductor is preferably made by growing a binary compound crystal or ternary compound crystal nitride semiconductor such as $Al_pGa_{1-p}N$ ($0\leq p<1$, n>p) or $In_rGa_{1-r}N$ ($0\leq r\leq 1$). If the p-type cladding layer 8 is such a multi-film layer made of the first nitride semiconductor layer and the second nitride semiconductor layer, the Al composition ratio of the p-type multi-film layer is an average value of the first and second layers. Further, if the later-mentioned p-type low concentration doped layer 9 is made of $Al_sGa_{1-s}N$ ($0<s<0.5$), the Al composition ratio of the multi-layered film p-type cladding layer is preferably adjusted to be higher than the Al composition ratio of the p-type low concentration doped layer 9, in view of obtaining a good electrostatic breakdown voltage and others.

If the p-type cladding layer 8 is made to have a super lattice structure, the crystallinity will be good, and there is a tendency that the resistivity decreases and Vf decreases.

The p-type impurity concentration of the multi-layered film p-type cladding layer 8 will be hereafter described.

The p-type impurity concentrations of the first nitride semiconductor layer and the second nitride semiconductor layer constituting the multi-layered film p-type cladding layer may be the same or different. First, a case in which the concentrations are different will be hereafter shown.

If the p-type impurity concentrations of the first nitride semiconductor layer and the second nitride semiconductor layer of the multi-layered film p-type cladding layer are different, the impurity concentration of one layer is made high and the impurity concentration of the other layer is made low. In this case, if the p-type impurity concentration of the first nitride semiconductor layer having a larger band gap energy is made high and the p-type impurity concentration of the second nitride semiconductor layer having a smaller band gap energy is made low, preferably undoped, then the threshold voltage, the value of Vf, and others can be reduced. Conversely, the p-type impurity concentration of the first nitride semiconductor layer having a larger band gap energy may be made low and the p-type impurity concentration of the second nitride semiconductor layer having a smaller band gap energy may be made high.

It seems that, if the first nitride semiconductor layer and the second nitride semiconductor layer having different p-type impurity concentrations are thus formed, a layer having a high carrier concentration and a layer having a high mobility can be allowed to exist simultaneously in the multi-layered film p-type cladding layer, so that the threshold voltage, the value of Vf, and others can be reduced.

In the case of different p-type impurity concentrations, the p-type impurity concentration in the first nitride semiconductor layer is not specifically limited as long as it is a value adjusted to be lower than the p-type impurity concentrations of the p-type high concentration doped layer 10 and the p-type contact layer 11 in the case where the p-type cladding layer is a multi-layered film. For example, a specific p-type impurity concentration of the first nitride semiconductor layer is adjusted to be within a range preferably from $5\times10^{17}/cm^3$ to $1\times10^{21}/cm^3$, more preferably from $5\times10^{18}/cm^3$ to $5\times10^{20}/cm^3$.

If the p-type impurity concentration of the first nitride semiconductor layer is not lower than $5\times10^{17}/cm^3$, the efficiency of carrier injection into the active layer will be good, and there is a tendency that the light-emission output is improved and Vf is reduced, whereas if it is not higher than $1\times10^{21}/cm^3$, there is a tendency that good crystallinity can be provided with ease.

On the other hand, the p-type impurity concentration of the second nitride semiconductor layer in the case where the first nitride semiconductor layer and the second nitride semiconductor layer have different p-type impurity concentrations is adjusted so that it will be lower than the p-type impurity concentration of the first nitride semiconductor layer and that the p-type cladding layer as a whole shows a lower concentration than the p-type impurity concentrations of the p-type high concentration doped layer 10 and the p-type contact layer 11.

A specific p-type impurity concentration of the second nitride semiconductor layer is not particularly limited. However, it is preferably not higher than ¹⁄₁₀ of the p-type impurity concentration of the aforesaid first nitride semiconductor layer, and more preferably if it is undoped, a layer having the highest mobility can be obtained. Even if it is undoped, there still exists a p-type impurity that diffuses into the second nitride semiconductor layer from the first nitride semiconductor side because the thickness of the second nitride semiconductor layer is small. If the mobility of the second nitride semiconductor layer is taken into account, the amount of the p-type impurity that diffuses from the first nitride semiconductor layer and exists in the second nitride semiconductor layer is preferably not larger than $1\times10^{20}/cm^3$.

Further, the same applies to the case in which the first nitride semiconductor layer having a larger band gap energy is doped with a smaller amount of a p-type impurity and the second nitride semiconductor layer having a smaller band gap energy is doped with a larger amount of a p-type impurity.

Next, the concentration of the p-type impurity in the case where the p-type impurity concentrations of the first nitride semiconductor layer and the second nitride semiconductor layer are the same will be shown hereafter.

In this case, it is sufficient if the p-type impurity concentrations of the first nitride semiconductor layer and the second nitride semiconductor layer are adjusted to form a layer doped at a lower concentration than the p-type impurity concentrations of the p-type high concentration doped layer 10 and the p-type cladding layer 11. For example, it is specifically a value within a range similar to the concentration of the impurity introduced into the first nitride semiconductor layer by doping in the case where the p-type impurity concentrations of the aforesaid first and second nitride semiconductor layers are different. If the first and second nitride semiconductor layers are thus doped with p-type impurity at the same concentration, it is easier to form a p-type cladding layer 8 having a high carrier concentration as compared with the aforesaid case of different concentrations, so that it is preferable in view of improvement in output, although the crystallinity is a little inferior.

A Group IIA or Group IIB element in the periodic table, such as Mg, Zn, Ca, or Be, is selected as the p-type impurity introduced into the aforesaid p-type cladding layer by doping, and preferably Mg, Ca, or the like is selected as the p-type impurity.

Further, in the case where the p-type impurity concentrations of nitride semiconductor layers (the first and second nitride semiconductor layers) which are adjacent to each other and constituting the aforesaid multi-layered film p-type cladding layer doped at a low concentration are different, it is preferable that the nitride semiconductor layer doped with a p-type impurity at a high concentration has a larger impurity concentration in the vicinity of the central portion of the nitride semiconductor layer and has a smaller impurity concentration (preferably undoped) in the vicinity of both end portions in the thickness direction, in view of reduction in resistivity.

Next, an explanation will be hereafter given on a case in which the p-type cladding layer 8 doped at a low concentration is composed of a single layer made of $Al_bGa_{1-b}N$ ($0 \leq b \leq 1$) containing a p-type impurity. Hereafter, the p-type cladding layer composed of a single film is referred to as a single film p-type cladding layer.

In the present invention, the single film p-type cladding layer 8 is a nitride semiconductor made of $Al_bGa_{1-b}N$ ($0 \leq b \leq 1$), as described above. Further, if the later-mentioned p-type low concentration doped layer 9 is made of $Al_sGa_{1-s}N$ ($0<s<0.5$), the Al composition ratio of the single film p-type cladding layer 8 is preferably adjusted to be higher than the Al composition ratio of the p-type low concentration doped layer 9, in view of obtaining a good electrostatic breakdown voltage.

The thickness of the single film p-type cladding layer 8 is not particularly limited; however, it is preferably not larger than 2000 angstrom, more preferably not larger than 1000 angstrom, still more preferably 500 to 100 angstrom. If the thickness is within the aforesaid range, it is preferable because the light-emission output is improved and Vf is reduced.

It is sufficient if the concentration of the p-type impurity in the single film p-type cladding layer 8 is lower than the p-type impurity concentrations of the p-type high concentration doped layer 10 and the p-type contact layer 11 in the same manner as in the case of the aforesaid multi-layered film p-type cladding layer, and it is adjusted to be within a range preferably from $5 \times 10^{17}/cm^3$ to $1 \times 10^{21}/cm^3$, more preferably from $5 \times 10^{18}/cm^3$ to $5 \times 10^{20}/cm^3$. If the impurity concentration is within the above-mentioned range, a good p-type film is formed to give a single film p-type cladding layer doped at a low concentration, so that it is preferable in view of improvement in light-emission output.

Further, the single film p-type cladding layer 8 will be almost similarly good as compared with the aforesaid p-type cladding layer having a multi-layered film structure, although the crystallinity is a little inferior. Furthermore, since the single film p-type cladding layer 8 is a single film, simplification of the production process will be possible, and it is preferable in the case of mass production.

Next, in FIG. 1, it is preferable if a p-type low concentration doped layer 9 containing a p-type impurity at a lower concentration than the p-type cladding layer 8 is formed on the p-type cladding layer 8, in view of improvement in electrostatic breakdown voltage and improvement in light-emission output as well as reduction in Vf.

The above-mentioned p-type low concentration doped layer 9 is not particularly limited, and may be a nitride semiconductor made of $In_rAl_sGa_{1-r-s}N$ ($0 \leq r<1$, $0 \leq s<1$, $r+s<1$). This layer 9 is preferably a nitride semiconductor made of $In_rGa_{1-r}N$ or $Al_sGa_{1-s}N$ of ternary compound crystal or binary compound crystal, more preferably a nitride semiconductor made of GaN or a nitride semiconductor made of $Al_sGa_{1-s}N$ ($0<s<0.5$) and having an Al composition ratio smaller than the average Al composition ratio of the aforesaid p-type multi-film layer or the Al composition ratio of the p-type single film layer (the Al composition ratio of the p-type cladding layer 8), in view of crystallinity. If the value of s in $Al_sGa_{1-s}N$ is within the range of $0<s<0.5$, it is preferable in view of restraining the rise of Vf and obtaining a good light-emission output and a good electrostatic breakdown voltage.

If the p-type low concentration doped layer 9 is GaN as described above, it is preferable in view of obtaining a better crystallinity and a good electrostatic breakdown voltage. Further, if the p-type low concentration doped layer is a nitride semiconductor made of $Al_sGa_{1-s}N$ ($0<s<0.5$) and having an Al composition ratio smaller than the Al composition ratio of the p-type cladding layer 8, a similar effect is obtained even if the thickness of the p-type low concentration doped layer 9 is made smaller than, for example, the thickness in the case where the p-type low concentration doped layer is GaN, so that the production time can be made shorter.

In the present invention, the thickness of the p-type low concentration doped layer 9 is not particularly limited; however, it is preferably 100 to 10000 angstrom, more preferably 500 to 8000 angstrom, still more preferably 1000 to 4000 angstrom. If the thickness is within the above-mentioned range, it is preferable in view of obtaining a good electrostatic breakdown voltage as well as a good light-emission output.

Furthermore, in the case where the p-type low concentration doped layer 9 is a nitride semiconductor made of $Al_sGa_{1-s}N$ ($0<s<0.5$) and having an Al composition ratio smaller than the Al composition ratio of the p-type cladding layer 8, it is sufficient if the thickness is suitably adjusted to be within the above-mentioned range and, in particular, it is preferably 300 to 5000 angstrom, more preferably 300 to 3000 angstrom. Even if the thickness is made thus small, a good effect can be obtained.

In the present invention, it is sufficient if the p-type impurity concentration of the p-type low concentration doped layer 9 is adjusted to be lower than the p-type impurity concentration of the p-type cladding layer 8, as described above. This adjustment of the p-type impurity concentration of the p-type low concentration doped layer 9 is not particularly limited. However, it is preferable if the layer 9 is grown as an undoped layer and the p-type impurity concentration is adjusted by the p-type impurity diffused from the p-type cladding layer 8 and the p-type high concentration doped layer 10, which are adjacent layers, in view of the adjustment of the p-type impurity concentration in the p-type low concentration doped layer. If the p-type impurity concentration of the p-type low concentration doped layer 9 is adjusted by the p-type impurity diffused from the layers adjacent to the p-type low concentration doped layer 9, it is preferable in view of the fact that it will be easier to adjust the concentration to be lower than the p-type impurity concentration of the p-type cladding layer 8, as described above. Further, the adjustment of the p-type impurity concentration of the p-type low concentration doped layer 9 of the present invention may be made by doping it with a impurity during the growth of the p-type low concentration doped layer 9.

Figure 2:
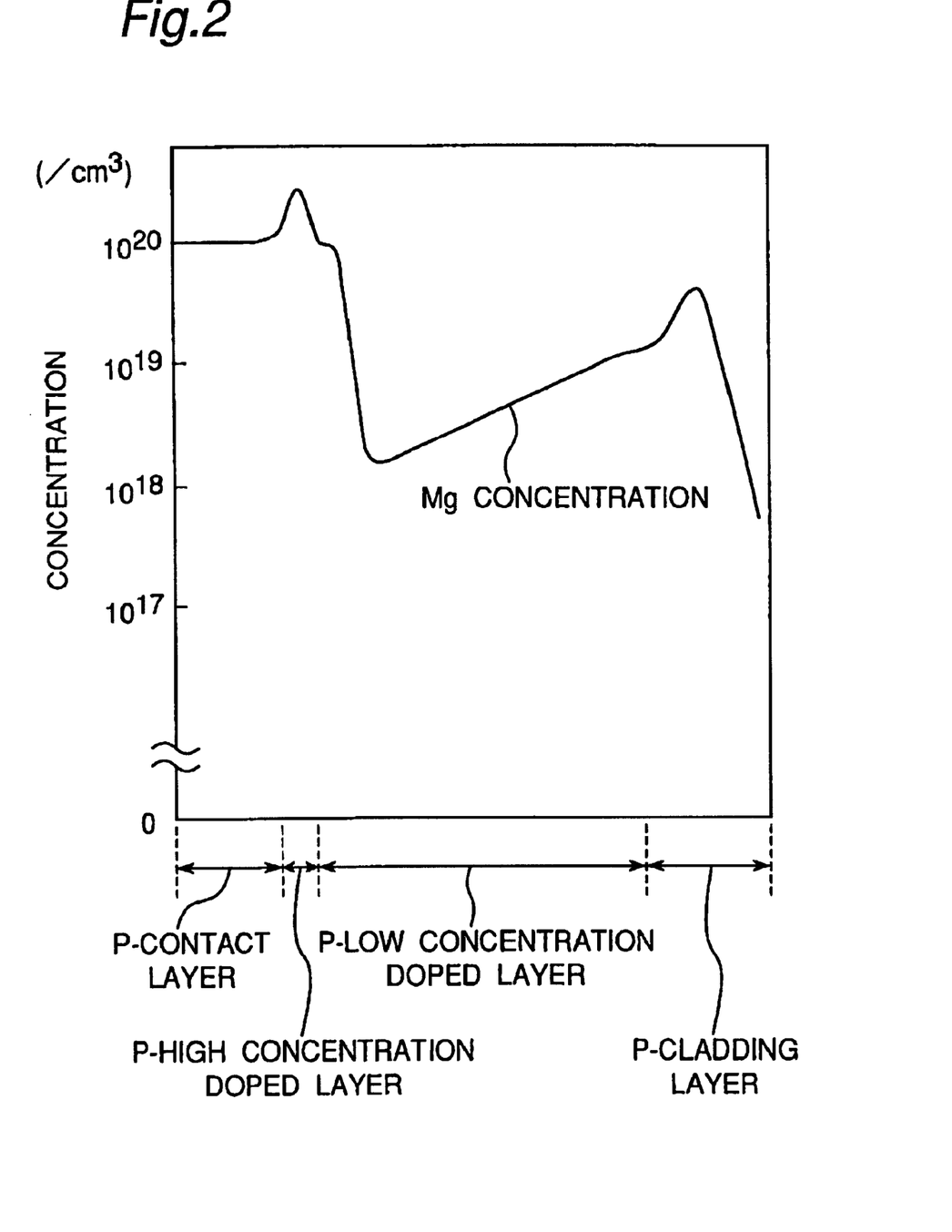
FIG. 2 is a model graph showing the manner of change with respect to the distribution of change in the p-type impurity concentration in the p-type low concentration doped layer 9, and the layers adjacent to and near to the layer, i.e. the p-type cladding layer 8 doped at a low concentration, the p-type high concentration doped layer 10 doped at a high concentration, and the p-type contact layer 11 doped at a middle concentration.

If the adjustment of the concentration of the p-type impurity of the p-type low concentration doped layer 9 of the present invention is made by diffusion from the adjacent layers as described above, the p-type impurity concentration in the p-type low concentration doped layer 9 varies, as shown in FIG. 2, within the low concentration doped layer 9. Also, if the p-type low concentration doped layer 9 is doped with a impurity during the growth of the p-type low concentration doped layer 9, there is a tendency that the concentration gradually decreases starting from the portion adjacent to the p-type cladding layer and the concentration at the portion adjacent to the p-type contact layer is the lowest, in almost the same manner as in FIG. 2.

With reference to the case in which the p-type low concentration doped layer 9 is grown to be undoped as an example, explanation will be given on an outline of the manner of change in the p-type impurity concentration within the p-type low concentration doped layer 9, by using FIG. 2. In FIG. 2, the vertical axis represents the concentration of a p-type impurity, and the horizontal axis represents the manner of change in the layers constituting the device structure from the surface of a p-side layer towards an n-side layer, i.e. the p-type contact layer 11, the p-type high concentration doped layer 10, the p-type low concentration doped layer 9, and the p-type cladding layer 8 (the length in the horizontal axis approximately represents a relative film thickness of each layer in the Example 1). Here, FIG. 2 is a model graph showing the state of the distribution of Mg concentration in the p-type cladding layer 8 doped at a low concentration, the p-type low concentration doped layer 9 doped at a concentration lower than the p-type cladding layer, the p-type high concentration doped layer 10, and the p-type contact layer 11 doped at a middle concentration in the later-mentioned Example 1.

As shown in FIG. 2, the relationship of the Mg concentration of the p-type cladding layer 8, the lowest concentration of Mg in the p-type low concentration doped layer 9, the Mg concentration of the p-type high concentration doped layer 10, and the Mg concentration of the p-type contact layer 11 is a low concentration, the lowest concentration, a high concentration and a middle concentration, respectively. Further, regarding the distribution of the Mg concentration within the p-type low concentration doped layer 9, the portion adjacent to the p-type cladding layer 8 approximately shows a value similar to the Mg concentration of the p-type cladding layer 8, but the concentration gradually decreases according as the position goes away from the p-type cladding layer 8, and the Mg concentration of the p-type low concentration doped layer 9 attains the lowest value at the portion adjacent to the p-type high concentration doped layer 10 doped at a high concentration. However, if the growth of the p-type high concentration doped layer 10 on the p-type low concentration doped layer 9 is started, the Mg concentration sharply rises as shown in FIG. 2. Such change in the Mg concentration of the p-type low concentration doped layer 9 seems to be brought about because the p-type low concentration doped layer 9 is grown to be undoped during the growth, and the p-type impurity mixes into the low concentration doped layer 9 by diffusion from adjacent layers during its growth and the growth of the adjacent layers. Also, a similar tendency is found, though there may be some difference in the value of the graph, if the p-type low concentration doped layer 9 is doped with a p-type impurity during its growth.

Thus, by forming the p-type low concentration doped layer 9 between the p-type high concentration doped layer 10 and the p-type cladding layer 8 as a layer doped at a lower concentration than the p-type impurity concentration of the p-type cladding layer 8, reduction of Vf can be made well together with improvement of the light-emission output and improvement of the electrostatic breakdown voltage.

In order to form the relationship of the concentrations of the p-type impurity as described above, the concentration of the p-type impurity in the p-type cladding layer and the concentration of the p-type impurity in the p-type contact layer are adjusted, and the lowest concentration of the p-type impurity in the p-type low concentration doped layer 9 is adjusted.

The p-type impurity concentration of the p-type low concentration doped layer 9 (here, this represents the concentration of the portion having the lowest p-type impurity concentration within the low concentration doped layer 9) is not particularly limited as long as the relationship of the p-type impurity concentrations with the adjacent layers is established as described above. However, it is preferably lower than $1\times10^{19}/cm^3$, more preferably $5\times10^{18}/cm^3$. The lower limit of the p-type impurity concentration is not particularly limited, and may be undoped; however, it is preferably, for example, not lower than $5\times10^{17}/cm^3$. The lowest p-type impurity concentration of the low concentration doped layer 9 varies depending on the p-type impurity concentration of the p-type cladding layer 8 and the thickness of the p-type low concentration doped layer 9. IF the p-type impurity concentration is within the above-mentioned range, it is preferable in view of electrostatic breakdown voltage and light-emission output.

The p-type impurity concentration of the p-type low concentration doped layer 9 is adjusted by growing it to be undoped during the growth or by growing it while adjusting the concentration of the impurity to be a low concentration, as described above. However, even if the p-type impurity concentration of the p-type cladding layer is the same, the lowest concentration value of the p-type low concentration doped layer may possibly be low if, for example, the thickness of the p-type low concentration doped layer is large. Thus, there is a tendency that the impurity concentration of the p-type low concentration doped layer varies depending on the concentrations of the adjacent layers, the growth temperature, the film thickness, the growth rate, and others. However, the impurity concentration of the p-type low concentration doped layer is adjusted by suitably selecting the optimal condition so that it will have a concentration lower than at least the p-type cladding layer and the p-type contact layer.

Next, in the present invention, the p-type high concentration doped layer 10 containing a p-type impurity at a concentration higher than the p-type impurity concentrations of the aforesaid p-type cladding layer and the later-mentioned p-type contact layer is not particularly limited, but may be, for example, a nitride semiconductor made of $In_rAl_sGa_{1-r-s}N$ ($0 \leq r<1, 0 \leq s<1, r+s<1$), preferably a nitride semiconductor of $In_rGa_{1-r}N$ or $Al_sGa_{1-s}N$ of ternary compound crystal or binary compound crystal, more preferably a nitride semiconductor made of GaN in view of crystallinity, in the same manner as the aforesaid p-type low concentration doped layer 9.

If the p-type high concentration doped layer 10 is GaN as described above, the crystallinity will be good and it is preferable in view of good electrostatic breakdown voltage and reduction in Vf.

In the present invention, the thickness of the p-type high concentration doped layer 10 is not particularly limited, but is preferably 50 to 5000 angstrom, more preferably 100 to 3000 angstrom, still more preferably 150 to 2000 angstrom. If the thickness is within the above-mentioned range, it is preferable in view of improvement in electrostatic breakdown voltage and reduction in Vf.

Further, it is sufficient if the p-type impurity concentration of the p-type high concentration doped layer 10 is adjusted to be a higher concentration than at least the p-type cladding layer 8 and the p-type contact layer 11. A preferable p-type impurity concentration is $5\times10^{18}$ to $1\times10^{22}/cm^3$ more preferably $1\times10^{19}$ to $5\times10^{21}/cm^3$. If the p-type impurity concentration is within the above-mentioned range, it is preferable in view of improvement in electrostatic breakdown voltage and reduction in Vf.

Further, the p-type high concentration doped layer 10 has a higher concentration than the p-type cladding layer 8 and the p-type contact layer 11, as shown in FIG. 2. Further, if the p-type low concentration doped layer 9 is not formed, the p-type impurity concentration value changes from the p-type impurity concentration value of the p-type cladding layer 8 to the p-type impurity concentration of the p-type high concentration doped layer 10.

Further, in the present invention, the p-type contact layer 11 doped with a p-type impurity at a middle concentration is not particularly limited, but may be, for example, a nitride semiconductor made of $In_rAl_sGa_{1-r-s}N$ ($0 \leq r < 1$, $0 \leq s < 1$, $r+s<1$), and is preferably constructed with a nitride semiconductor of ternary compound crystal, more preferably a nitride semiconductor made of binary compound crystal GaN that does not contain In or Al, in the same manner as the aforesaid low concentration doped layer 9. If it is a ternary compound crystal rather than a quaternary compound crystal, or if it is GaN that does not contain In or Al rather than a ternary compound crystal, it is preferable because the crystallinity will be good. Further, if it is a binary compound crystal that does not contain In or Al, it is preferable because the ohmic contact with the p-electrode 11 will be better and there is a tendency that the light-emission efficiency will be improved.

The thickness of the p-type contact layer 11 is 0.001 to 0.5 $\mu$m, preferably 0.01 to 0.3 $\mu$m, more preferably 0.05 to 0.2 $\mu$m. If the film thickness is within the above-mentioned range, it is preferable in view of reduction in Vf and improvement in the electrostatic breakdown voltage.

Further, the p-type impurity of the p-type contact layer 11 doped at a middle concentration may be one of the variety of the aforesaid p-type impurity, and is preferably Mg. If the p-type impurity is Mg, p-type characteristics are more easily obtained, and there is a tendency that the ohmic contact is more easily obtained. The impurity concentration of the p-type contact layer 11 is not particularly limited, and it is sufficient if the impurity concentration is a middle concentration lying between the p-type impurity concentrations of the p-type cladding layer 8 and the high concentration doped layer 10, as described above. For example, a specific value within the range satisfying the relationship is preferably $1 \times 10^{18}$ to $5 \times 10^{21}/cm^3$ more preferably $5 \times 10^{19}$ to $3 \times 10^{20}/cm^3$, still more preferably about $1 \times 10^{20}/cm^3$. If the p-type impurity concentration is within this range, it is preferable in view of reduction in Vf.

Further, the n-electrode 13 is formed on the n-side contact layer 4, and the p-electrode 12 is formed on the p-side contact layer 11 doped with a p-type impurity at a high concentration. The source materials for the n-electrode 13 and the p-electrode 12 are not particularly limited. For example, W/Al or the like can be used as the n-electrode 13, and Ni/Au can be used as the p-electrode 12.

In the present invention, the method for growing the nitride semiconductors may be one of a variety of vapor phase growth method. For example, it is possible to apply all the methods known in the art for growing nitride semiconductor, such as MOVPE (metal organic vapor phase epitaxy), HVPE (hydride vapor phase epitaxy), MBE (molecular beam epitaxy), MOCVD (metal organic chemical vapor deposition), or two-flow MOCVD. In the case where the film thickness is not larger than 50 $\mu$m, a preferable growth method is the MOCVD method, because the growth rate can be easily controlled. Further, in the case where the film thickness is not larger than 50 $\mu$m, if the HVPE method is used, the growth rate is too large and its control is difficult.

EXAMPLES

Hereafter, Examples of the present invention will be shown. However, the present invention is not limited to these.

Example 1

Example 1 will be described with reference to FIG. 1.

A substrate 1 made of sapphire (C surface) is set in a reaction vessel of MOCVD and, while allowing hydrogen to flow, the substrate temperature is raised up to 1050° C. for cleaning the substrate.

(Buffer Layer 2)

Subsequently, the temperature is lowered to 510° C., and a buffer layer 2 made of GaN is formed to a thickness of about 100 angstrom on the substrate 1 by using hydrogen as a carrier gas and using ammonia and TMG (trimethylgallium) as source material gases.

(Undoped GaN Layer 3)

After the buffer layer 2 is grown, only TMG is stopped, and the temperature is raised up to 1050° C. When the temperature has reached 1050° C., an undoped GaN layer 3 is grown to a thickness of 1.5 $\mu$m by likewise using TMG and ammonia gas as source material gases.

(n-type Contact Layer 4)

Subsequently, an n-type contact layer 4 made of GaN doped with Si at $4.5 \times 10^{18}/cm^3$ is grown to a thickness of 2.265 $\mu$m by likewise using TMG and ammonia gas as source material gases and using silane gas as a impurity gas.

(n-type First Multi-film Layer 5)

Next, only the silane gas is stopped, and a lower layer 5a made of undoped GaN is grown to a thickness of 2000 angstrom at 1050° C. by using TMG and ammonia gas. Then, a silane gas is added at the same temperature to grow a middle layer 5b made of GaN doped with Si at $4.5 \times 10^{18}/cm^3$ to a thickness of 300 angstrom. Further, only the silane gas is stopped to grow an upper layer 5c made of undoped GaN to a thickness of 50 angstrom at the same temperature, thereby to grow a first multi-film layer 5 made of three layers and having a total thickness of 2350 angstrom.

(n-type Second Multi-film Layer 6)

Next, at a similar temperature, a fourth nitride semiconductor layer made of undoped GaN is grown to a thickness of 40 angstrom, and then the temperature is set at 800° C. to grow a third nitride semiconductor layer made of undoped $In_{0.13}Ga_{0.87}N$ to a thickness of 20 angstrom by using TMG, TMI, and ammonia. Then, these operations are repeated to alternately laminate the fourth layer and the third layer in this order each for 10 layers, and finally the fourth nitride semiconductor layer made of GaN is grown to a thickness of 40 angstrom to grow an n-type second multi-film layer 6 made of a multi-layered film of super lattice structure to a thickness of 640 angstrom.

(Active Layer 7)

Next, a barrier layer made of undoped GaN is grown to a thickness of 200 angstrom, and then the temperature is set at 800° C. to grow a well layer made of undoped $In_{0.4}Ga_{0.6}N$ to a thickness of 30 angstrom by using TMG, TMI, and ammonia. Then, five barrier layers and four well layers are alternately laminated in the order of barrier+well+barrier+well . . . +barrier to grow an active layer 7 made of a multi-quantum well structure having a total thickness of 1120 angstrom.

(Multi-layered Film p-type Cladding Layer 8)

Next, a first nitride semiconductor layer made of p-type $Al_{0.2}Ga_{0.8}N$ doped with Mg at $5 \times 10^{19}/cm^3$ is grown to a thickness of 40 angstrom at a temperature of 1050° C. by using TMG, THA, ammonia, and $Cp_2Mg$ (cyclopentadienylmagnesium). Subsequently, the temperature is set at 800° C., and a second nitride semiconductor layer made of $In_{0.03}Ga_{0.97}N$ with Mg at $5 \times 10^{19}/cm^3$ is grown to a thickness of 25 angstrom by using TMG, TMI, ammonia, and $Cp_2Mg$ (cyclopentadienylmagnesium). Then, these operations are repeated to alternately laminate the first layer and the second layer in this order each for five layers, and finally the first nitride semiconductor layer is grown to a thickness of 40 angstrom to grow a p-side multi-layered film cladding layer 8 made of a multi-layered film of super lattice structure to a thickness of 365 angstrom. (p-type low concentration doped layer 9 doped at a lower concentration than the p-type cladding layer)

Subsequently, a p-type low concentration doped layer 9 made of undoped GaN is grown to a thickness of 2000 angstrom at 1050° C. by using TMG and ammonia. At the time of growth, this low concentration doped layer 9 is grown to be undoped. However, Mg contained in the multi-layered film p-type cladding layer 8 doped at a low concentration diffuses while the p-type low concentration doped layer 9 is grown, and further, Mg diffuses while the following p-type high concentration doped layer 10 doped at a high concentration is grown, so that the p-type low concentration doped layer 9 shows p-type.

The Mg concentration of the p-type low concentration doped layer 9 is $2 \times 10^{18}/cm^3$ at the portion having the lowest concentration. Further, the change in the Mg concentration of the low concentration doped layer 9 is such that, as shown in FIG. 2, the portion in contact with the p-type cladding layer 8 shows approximately the same value as the Mg concentration of the p-type cladding layer, but the Mg concentration gradually decreases according as the position goes away from the p-type cladding layer 8, and the Mg concentration around the position near to the p-type high concentration doped layer 10 (immediately before the p-type high concentration doped layer 10 is grown) shows approximately the lowest value.

(p-type High Concentration Doped Layer 10)

Subsequently, a p-type high concentration doped layer 10 made of GaN doped with Mg at a concentration of $3 \times 10^{20}/cm^3$ is grown to a thickness of 500 angstrom at a similar temperature by using TMG, ammonia, and Cp$_2$Mg.

(p-type Contact Layer 11)

Subsequently, a p-type contact layer 11 made of GaN doped with Mg at a concentration of $1 \times 10^{20}/cm^3$ is grown to a thickness of 1200 angstrom at a similar temperature by using TMG, ammonia, and Cp$_2$Mg.

After the reaction is ended, the temperature is lowered to room temperature, and further the wafer is set in a reaction vessel in a nitrogen atmosphere to perform an annealing treatment at 700° C., thereby to allow the p-type layers to have a further lower resistance.

After the annealing, the wafer is taken out from the reaction vessel, and a mask having a predetermined shape is formed on a surface of the p-type contact layer 11 which is the uppermost layer, and an etching treatment is carried out starting from the p-type contact layer 11 side by the RIE (reactive ion etching) apparatus to expose a surface of the n-type contact layer 4 as shown in FIG. 1.

After the etching, a light-transmitting p-electrode 12 containing Ni and Au and having a thickness of 200 angstrom is formed over almost the entire surface of the p-type contact layer 11 which is the uppermost layer, and a p-pad electrode made of Au for bonding is formed to a thickness of 0.5 μm on the p-electrode 12. On the other hand, an n-electrode 13 containing W and Al was formed on the surface of the n-type contact layer 4 exposed by etching, thereby completing a LED device.

This LED device showed a pure green light-emission of 520 nm at a forward electric current of 20 mA, and Vf was 3.4 V, which shows that Vf is reduced nearly by 1.0 V as compared with a conventional LED device having a multi-quantum well structure, and the output showed an improvement of more than 2.0 times. Further, the electrostatic breakdown voltage of the obtained LED was each measured by gradually applying a voltage in a reverse direction and in a forward direction from each electrode of the n-layer and the p-layer of the LED device, and it was approximately more than 2.0 times as compared with the conventional one.

Here, the construction of the conventional LED device is such that a second buffer layer made of undoped GaN, an n-side contact layer made of GaN doped with Si, an active layer having the same multi-quantum well structure as in Example 1, a single Al$_{0.1}$Ga$_{0.9}$N layer doped with Mg, and a p-side contact layer made of GaN doped with Mg are successively laminated on a first buffer layer made of GaN.

Example 2

A LED device was fabricated in the same manner as in Example 1 except that the active layer 7 was changed as follows.

(Active Layer 7)

Next, a barrier layer made of undoped GaN is grown to a thickness of 250 angstrom, and then the temperature is set at 800° C. to grow a well layer made of undoped In$_{0.3}$Ga$_{0.7}$N to a thickness of 30 angstrom by using TMG, TMI, and ammonia. Then, seven barrier layers and six well layers are alternately laminated in the order of barrier+well+barrier+well . . . +barrier to grow an active layer 7 made of a multi-quantum well structure having a total thickness of 1930 angstrom.

The obtained LED device showed a pure blue light-emission of 470 nm at a forward electric current of 20 mA, and a good result is obtained in the same manner as in Example 1.

Example 3

A LED device was fabricated in the same manner as in Example 1 except that the active layer 7 was changed as follows.

(Active Layer 7)

Next, a barrier layer made of undoped GaN is grown to a thickness of 250 angstrom, and then the temperature is set at 800° C. to grow a well layer made of undoped In$_{0.3}$Ga$_{0.7}$N to a thickness of 30 angstrom by using TMG, TMI, and ammonia. Then, six barrier layers and five well layers are alternately laminated in the order of barrier+well+barrier+well . . . +barrier to grow an active layer 7 made of a multi-quantum well structure having a total thickness of 1650 angstrom.

The obtained LED device showed a pure blue light-emission of 470 nm at a forward electric current of 20 mA, and a good result is obtained in the same manner as in Example 1.

Example 4

A LED device was fabricated in the same manner as in Example 1 except that the active layer 7 was changed as follows.

(Active Layer 7)

Next, a barrier layer made of undoped GaN is grown to a thickness of 250 angstrom, and then the temperature is set at 800° C. to grow a well layer made of undoped In$_{0.35}$Ga$_{0.65}$N to a thickness of 30 angstrom by using TMG, TMI, and ammonia. Then, seven barrier layers and six well layers are alternately laminated in the order of barrier+well+barrier+well . . . +barrier to grow an active layer 7 made of a multi-quantum well structure having a total thickness of 1930 angstrom.

The obtained LED device showed a blue green light-emission of 500 nm at a forward electric current of 20 mA, and a good result is obtained in the same manner as in Example 1.

Example 5

A LED device was fabricated in the same manner as in Example 1 except that the active layer 7 was changed as follows.

(Active Layer 7)

Next, a barrier layer made of undoped GaN is grown to a thickness of 250 angstrom, and then the temperature is set at 800° C. to grow a well layer made of undoped $In_{0.35}Ga_{0.65}N$ to a thickness of 30 angstrom by using TMG, TMI, and ammonia. Then, four barrier layers and three well layers are alternately laminated in the order of barrier+well+barrier+well . . . +barrier to grow an active layer 7 made of a multi-quantum well structure having a total thickness of 1090 angstrom.

The obtained LED device showed a blue green light-emission of 500 nm at a forward electric current of 20 mA, and a good result is obtained in the same manner as in Example 1.

Example 6

A LED device was fabricated in the same manner as in Example 1 except that the n-side second multi-film layer 6 was not grown.

In the obtained LED device, the electrostatic breakdown voltage and Vf show approximately the same good characteristics as in Example 1, although the light-emission output is a little lower as compared with Example 1.

Example 7

A LED device was fabricated in the same manner as in Example 1 except that the multi-layered film p-type cladding layer 8 was changed as follows.

(Single Film p-type Cladding Layer 8)

A single film p-type cladding layer 8 made of p-type $Al_{0.16}Ga_{0.84}N$ doped with Mg at $5\times10^{19}/cm^3$ is grown to a thickness of 300 angstrom at a temperature of 1050+C. by using TMG, TMA, ammonia, and $Cp_2Mg$ (cyclopentadienylmagnesium).

In the obtained LED device, the cladding layer is grown as a single layer instead of forming it into a super lattice. However, by combination with other layer constructions, the electrostatic breakdown voltage and Vf show almost the same characteristics as in Example 1 and a good result is obtained, although performances such as light-emission output are a little inferior as compared with Example 1. Further, if a single layer is formed, the production process can be simplified as compared with forming a multi-film layer, so that it is preferable.

Example 8

A LED device was fabricated in the same manner as in Example 1 except that the p-type low concentration doped layer 9 was not grown.

The obtained LED device shows almost the same characteristics as in Example 1 and a good result is obtained, although there is a tendency that the electrostatic breakdown voltage decreases a little as compared with Example 1.

Example 9

A LED device was fabricated in the same manner as in Example 1 except that the thicknesses of the n-type contact layer 4 and the n-type first multi-film layer 5 were changed as follows.

(n-type Contact Layer 4)

An n-type contact layer 4 is grown in the same manner as the n-type contact layer 4 of Example 1 except that the thickness was changed to 2.165 μm.

(n-type First Multi-film Layer 5)

Next, only the silane gas is stopped, and a lower layer 5a made of undoped GaN is grown to a thickness of 3000 angstrom at 1050° C. by using TMG and ammonia gas. Then, a silane gas is added at the same temperature to grow a middle layer 5b made of GaN doped with Si at $4.5\times10^{18}/cm^3$ to a thickness of 300 angstrom. Further, only the silane gas is stopped to grow an upper layer 5c made of undoped GaN to a thickness of 50 angstrom at the same temperature, thereby to grow a first multi-film layer 5 made of three layers and having a total thickness of 3350 angstrom.

The obtained LED device shows approximately the same characteristics as in Example 1 and a good result is obtained.

Example 10

A LED device is fabricated in the same manner as in Example 9 except that the thickness of the n-type contact layer 4 is set to be 4.165 μm, and the combined thickness of the undoped GaN layer 3 and the n-type first multi-film layer 5 is set to be 6.0 μm.

The obtained LED device shows a little improvement in the electrostatic breakdown voltage as compared with Example 9, and the other characteristics are shown to be approximately the same as in Example 9 and a good result is obtained.

Example 11

A LED device is fabricated in the same manner as in Example 9 except that the thickness of the p-type low concentration doped layer 9 is set to be 3000 angstrom and the Mg concentration of the p-type low concentration doped layer 9 is approximately $1\times10^{18}/cm^3$.

The obtained LED device shows approximately the same characteristics as in Example 9 and a good result is obtained.

Example 12

A LED device is fabricated in the same manner as in Example 9 except that the Mg concentration of the first nitride semiconductor layer and the second nitride semiconductor layer of the multi-layered film p-type cladding layer 8 doped at a low concentration is set to be $1\times10^{19}/cm^3$, the Mg concentration of the p-type low concentration doped layer 9 doped at a lower concentration than the p-type cladding layer 8 is approximately $1\times10^{18}/cm^3$, the Mg concentration of the p-type high concentration doped layer 10 doped at a high concentration is approximately $1\times10^{20}/cm^3$, and the Mg concentration of the p-type contact layer 11 doped at a middle concentration is approximately $5\times10^{19}/cm^3$.

The obtained LED device gives a good result almost in the same manner as in Example 9.

Example 13

A LED device is fabricated in the same manner as in Example 9 except that the Mg concentration of the first nitride semiconductor layer of the multi-layered film p-type cladding layer 8 doped at a low concentration is set to be $5\times10^{19}/cm^3$, and the second nitride semiconductor layer is formed to be undoped, so as to form the multi-layered film p-type cladding layer 8 with the use of the first nitride semiconductor layer and the second nitride semiconductor layer having different impurity concentrations. The average Mg concentration of the total multi-layered film p-type cladding layer 8 doped at a low concentration is $2\times10^{19}/cm^3$, the lowest value of the Mg concentration of the adjacent p-type low concentration doped layer 9 is $3\times10^{18}/cm^3$, the Mg concentration of the p-type high concentration doped layer 10 doped at a high concentration is $3\times10^{20}/cm^3$, and the Mg concentration of the p-type contact layer 11 is $1\times10^{20}/cm^3$.

The obtained LED device gives a good result almost in the same manner as in Example 9.

Example 14

A LED device is fabricated in the same manner as in Example 1 except that a p-type low concentration doped layer 9 made of $Al_{0.05}Ga_{0.95}N$ is grown to a thickness of 1000 angstrom by using TMG, ammonia, and TMA. The Mg concentration at the portion having the lowest concentration in the p-type low concentration doped layer 9 is lower than the Mg concentrations of the p-type cladding layer 8 and the p-type contact layer 10.

The obtained LED device gives a good result almost in the same manner as in Example 1.

Example 15

A LED device is fabricated in the same manner as in Example 1 except that a p-type low concentration doped layer 9 made of $Al_{0.05}Ga_{0.95}N$ to a thickness of 2000 angstrom by using TMG, ammonia, and TMA. The Mg concentration at the portion having the lowest concentration in the p-type low concentration doped layer 9 is lower than the Mg concentrations of the p-type cladding layer 8 and the p-type contact layer 10.

The obtained LED device shows a little better electro-static breakdown voltage as compared with Example 1, and the other characteristics are shown to be almost the same as in Example 1 and a good result is obtained.

Example 16

A LED device is fabricated in the same manner as in Example 1 except that a p-type low concentration doped layer 9 made of GaN having a thickness of 2000 angstrom is grown by using TMG, $Cp_2Mg$, and ammonia in growing the p-type low concentration doped layer 9 and by adjusting the flow rate of the gas of $Cp_2Mg$ so that the Mg concentration of the portion having the lowest concentration will be $8\times10^{18}/cm^3$.

The obtained LED device gives a good result almost in the same manner as in Example 1.

Example 17

A LED device is fabricated in the same manner as in Example 9 except that the thickness of the p-type low concentration doped layer 9 is set to be 1000 angstrom and the Mg concentration of the portion having the lowest concentration in the p-type low concentration doped layer 9 is approximately $6.4\times10^{18}/cm^3$.

The obtained LED device gives a good result almost in the same manner as in Example 9.

Example 18

Two kinds of LED devices are fabricated in the same manner as in Example 9 except that the thickness of the n-type contact layer 4 is set to be 5.165 $\mu$m and 7.165 $\mu$m, and the combined thickness of the undoped GaN layer 3, the n-type contact layer 4, and the n-type first multi-film layer 5 is set to be 7.0 $\mu$m and 9.0 $\mu$m, respectively.

The obtained LED device shows a little better electro-static breakdown voltage as compared with Example 9, but both show almost the same characteristics as in Example 9 and a good result is obtained.

Example 19

A LED device is fabricated in the same manner as in Example 9 except that the multi-layered film p-type cladding layer 8 doped at a middle concentration is a multi-layered film composed of a first nitride semiconductor layer made of undoped $Al_{0.2}Ga_{0.8}N$ and a second nitride semiconductor layer made of $In_{0.03}Ga_{0.97}N$ doped with Mg at $5\times10^{19}/cm^3$.

The obtained LED device shows almost the same characteristics as in Example 9.

Example 20

A LED device is fabricated in the same manner as in Example 9 except that the n-type first multi-film layer 5 is formed by growing a lower layer 5a made of undoped GaN and having a thickness of 3000 angstrom, a middle layer 5b made of $Al_{0.1}Ga_{0.9}N$ doped at $4.5\times10^{18}/cm^3$ and having a thickness of 300 angstrom, and an upper layer 5c made of undoped GaN and having a thickness of 50 angstrom.

The obtained LED device has almost the same characteristics as in Example 9, and a good result is obtained.

Example 21

A LED device is fabricated in the same manner as in Example 9 except that the n-type first multi-film layer 5 is formed by growing a lower layer 5a made of undoped $Al_{0.1}Ga_{0.9}N$ and having a thickness of 3000 angstrom, a middle layer 5b made of $Al_{0.1}Ga_{0.9}N$ doped at $4.5\times10^{18}/cm^3$ and having a thickness of 300 angstrom, and an upper layer 5c made of undoped $Al_{0.1}Ga_{0.9}N$ and having a thickness of 50 angstrom.

The obtained LED device has almost the same characteristics as in Example 9, and a good result is obtained.

Example 22

A LED device is fabricated in the same manner as in Example 9 except that the n-side first multi-film layer 5 is formed by growing a lower layer 5a made of undoped $Al_{0.1}Ga_{0.9}N$ and having a thickness of 3000 angstrom, a middle layer 5b made of GaN doped at $4.5\times10^{18}/cm^3$ and having a thickness of 300 angstrom, and an upper layer 5c made of undoped GaN and having a thickness of 50 angstrom.

The obtained LED device has almost the same characteristics as in Example 9, and a good result is obtained.

Example 23

A LED device is fabricated in the same manner as in Example 9 except that the n-side contact layer 4 is made of $Al_{0.05}Ga_{0.95}N$ doped with Si at $4.5\times10^{18}/cm^3$ and having a thickness of 4.165 $\mu$m.

The obtained LED device shows almost the same characteristics as in Example 9.

Example 24

A LED device is fabricated in the same manner as in Example 1 except that a single undoped layer made of undoped GaN and having a thickness of 1500 angstrom is formed in place of the n-type first multi-film layer 5.

The obtained LED device shows almost the same device characteristics as in Example 1, although there is a tendency that the electrostatic breakdown voltage decreases a little as compared with Example 1.

Example 25

A LED device is fabricated in the same manner as in Example 1 except that the n-type second multi-film layer 6 is a multi-layered film composed of a fourth nitride semiconductor layer made of undoped GaN and a third nitride semiconductor layer made of $Al_{0.13}Ga_{0.87}N$ doped with Si at $5\times10^{17}/cm^3$.

The obtained LED device shows almost the same device characteristics as in Example 1.

As described above, the present invention can provide a nitride semiconductor device capable of reducing the value of Vf, and further the device of the present invention has good electrostatic breakdown voltage and good light-emission output.

What is claimed is:

1. A nitride semiconductor device comprising;
   a substrate,
   an n-type nitride semiconductor layer formed on the substrate,
   an active layer formed on the n-type nitride semiconductor layer and,
   a p-type nitride semiconductor layer formed on the active layer,
   wherein said active layer has a quantum well structure including a well layer made of a nitride semiconductor containing In and,
   said p-type nitride semiconductor layer has a p-type contact layer, a p-type high concentration doped layer interposed between said active layer and said p-type contact layer and a p-type multi-film layer interposed between said active layer and said p-type high concentration doped layer,
   said p-type multi-film layer formed by laminating alternately first nitride semiconductor layers containing Al and second nitride semiconductor layers having a different composition from said first nitride semiconductor layer, at least ones of said first nitride semiconductor layers and said second nitride semiconductor layers containing a p-type impurity,
   said p-type contact layer having a p-type impurity concentration higher than that of said p-type multi-film layer and lower than that of said p-type high concentration doped layer.

2. A nitride semiconductor device according to claim 1 further comprising;
   a p-type low concentration doped layer interposed between said p-type multi-film layer and said p-type high concentration doped layer, said p-type low concentration doped layer having a p-type impurity concentration lower than that of said p-type multi-film layer.

3. A nitride semiconductor device comprising;
   a substrate,
   an n-type nitride semiconductor layer formed on the substrate,
   an active layer formed on the n-type nitride semiconductor layer and,
   a p-type nitride semiconductor layer formed on the active layer,
   wherein said active layer has a quantum well structure including a well layer made of a nitride semiconductor containing In and,
   said p-type nitride semiconductor layer has a p-type contact layer, a p-type high concentration doped layer interposed between said active layer and said p-type contact layer and a p-type single film layer made of $Al_bGa_{1-b}N$ ($0\leq b\leq 1$) containing a p-type impurity interposed between said active layer and said p-type high concentration doped layer,
   said p-type contact layer having a p-type impurity concentration higher than that of said p-type single film layer and lower than that of the said p-type high concentration doped layer.

4. A nitride semiconductor device according to claim 3 further comprising;
   a p-type low concentration doped layer interposed between said p-type single film layer and said p-type high concentration doped layer, said p-type low concentration doped layer having a p-type impurity concentration lower than that of said p-type single film layer.

5. A nitride semiconductor device as in claims 1 or 2; characterized in that said p-type multi-film layer has a p-type impurity concentration in a range from $5\times10^{17}$ to $1\times10^{21}/cm^3$.

6. A nitride semiconductor device as in claims 3 or 4; characterized in that said p-type single film layer has a p-type impurity concentration in a range from $5\times10^{17}$ to $1\times10^{21}/cm^3$.

7. A nitride semiconductor device as in one of claims 1 to 4;
   characterized in that said p-type high concentration doped layer has a p-type impurity concentration in the range from $5\times10^{18}$ to $1\times10^{22}/cm^3$.

8. A nitride semiconductor device as in one of claims 1 to 4;
   characterized in that said p-type contact layer has a p-type impurity concentration in a range from $1\times10^{18}$ to $5\times10^{21}/cm^3$.

9. A nitride semiconductor device as in one of claims 2 or 4;
   characterized in that said p-type low concentration doped layer has a p-type impurity concentration less than $1\times10^{19}/cm^3$.

10. A nitride semiconductor device as claimed in claim 5;
    characterized in that said p-type high concentration doped layer has a p-type impurity concentration in the range from $5\times10^{18}$ to $1\times10^{22}/cm^3$.

11. A nitride semiconductor device as claimed in claim 6;
    characterized in that said p-type high concentration doped layer has a p-type impurity concentration in the range from $5\times10^{18}$ to $1\times10^{22}/cm^3$.

12. A nitride semiconductor device as claimed in claim 5;
    characterized in that said p-type contact layer has a p-type impurity concentration in a range from $1\times10^{18}$ to $5\times10^{21}/cm^3$.

13. A nitride semiconductor device as claimed in claim 6;
    characterized in that said p-type contact layer has a p-type impurity concentration in a range from $1\times10^{18}$ to $5\times10^{21}/cm^3$.

14. A nitride semiconductor device as claimed in claim 7;
    characterized in that said p-type contact layer has a p-type impurity concentration in a range from $1\times10^{18}$ to $5\times10^{21}/cm^3$.

15. A nitride semiconductor device as claimed in claim 5; characterized in that said p-type low concentration doped layer has a p-type impurity concentration less than $1\times10^{19}/cm^3$.

16. A nitride semiconductor device as claimed in claim 6; characterized in that said p-type low concentration doped layer has a p-type impurity concentration less than $1\times10^{19}/cm^3$.

17. A nitride semiconductor device as claimed in claim 7; characterized in that said p-type low concentration doped layer has a p-type impurity concentration less than $1\times10^{19}/cm^3$.

18. A nitride semiconductor device as claimed in claim 8; characterized in that said p-type low concentration doped layer has a p-type impurity concentration less than $1\times10^{19}/cm^3$.

* * * * *